(12) United States Patent
Chrysostomides et al.

(10) Patent No.: US 6,441,469 B1
(45) Date of Patent: Aug. 27, 2002

(54) SEMICONDUCTOR MEMORY CONFIGURATION WITH DUMMY COMPONENTS ON CONTINUOUS DIFFUSION REGIONS

(75) Inventors: Athanasia Chrysostomides, Munich; Robert Feurle, Neubiberg; Dominique Savignac, Ismaning; Helmut Schneider, Munich, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/511,812

(22) Filed: Feb. 24, 2000

(30) Foreign Application Priority Data

Feb. 24, 1999 (DE) .......................................... 199 07 921

(51) Int. Cl.$^7$ ............................................ H01L 23/552
(52) U.S. Cl. ...................... 257/659; 257/660; 257/428; 257/48; 257/390; 257/202
(58) Field of Search ................................ 257/202, 390, 257/659, 660, 428, 48

(56) References Cited

U.S. PATENT DOCUMENTS

| | | | |
|---|---|---|---|
| 4,916,514 A | * | 4/1990 | Nowak ........................ 357/68 |
| 5,396,100 A | | 3/1995 | Yamasaki et al. |
| 5,468,983 A | | 11/1995 | Hirase et al. |
| 5,580,810 A | * | 12/1996 | Katto et al. .................... 437/52 |
| 5,763,955 A | * | 6/1998 | Findley et al. ............... 257/775 |
| 5,770,874 A | * | 6/1998 | Egawa ........................ 257/296 |
| 5,796,148 A | | 8/1998 | Gorman |
| 5,867,434 A | * | 2/1999 | Oh et al. ..................... 365/200 |
| 5,945,702 A | * | 8/1999 | Nakanishi ................... 257/296 |
| 5,959,920 A | * | 9/1999 | Kiyota ........................ 365/207 |
| 5,981,384 A | * | 11/1999 | Juengling ................... 438/666 |
| 6,081,272 A | * | 6/2000 | Morimoto et al. .......... 345/420 |
| 6,185,131 B1 | * | 2/2001 | Kouchi .................... 365/185.2 |

FOREIGN PATENT DOCUMENTS

DE           19703611 A1      8/1998

* cited by examiner

Primary Examiner—Eddie Lee
Assistant Examiner—Eugene Lee
(74) Attorney, Agent, or Firm—Laurence A. Greenberg; Werner H. Stemer; Ralph E. Locher

(57) ABSTRACT

The semiconductor memory configuration has at least two memory cell arrays. The open area between the strips of the sense-amp transistors in the two memory cell arrays contains dummy transistors. This avoids proximity effects at the edges of the sense-amp transistors adjoining the open area. The sense-amp transistors and the dummy transistors are arranged in a common, continuous diffusion region.

3 Claims, 2 Drawing Sheets

Figure 1:
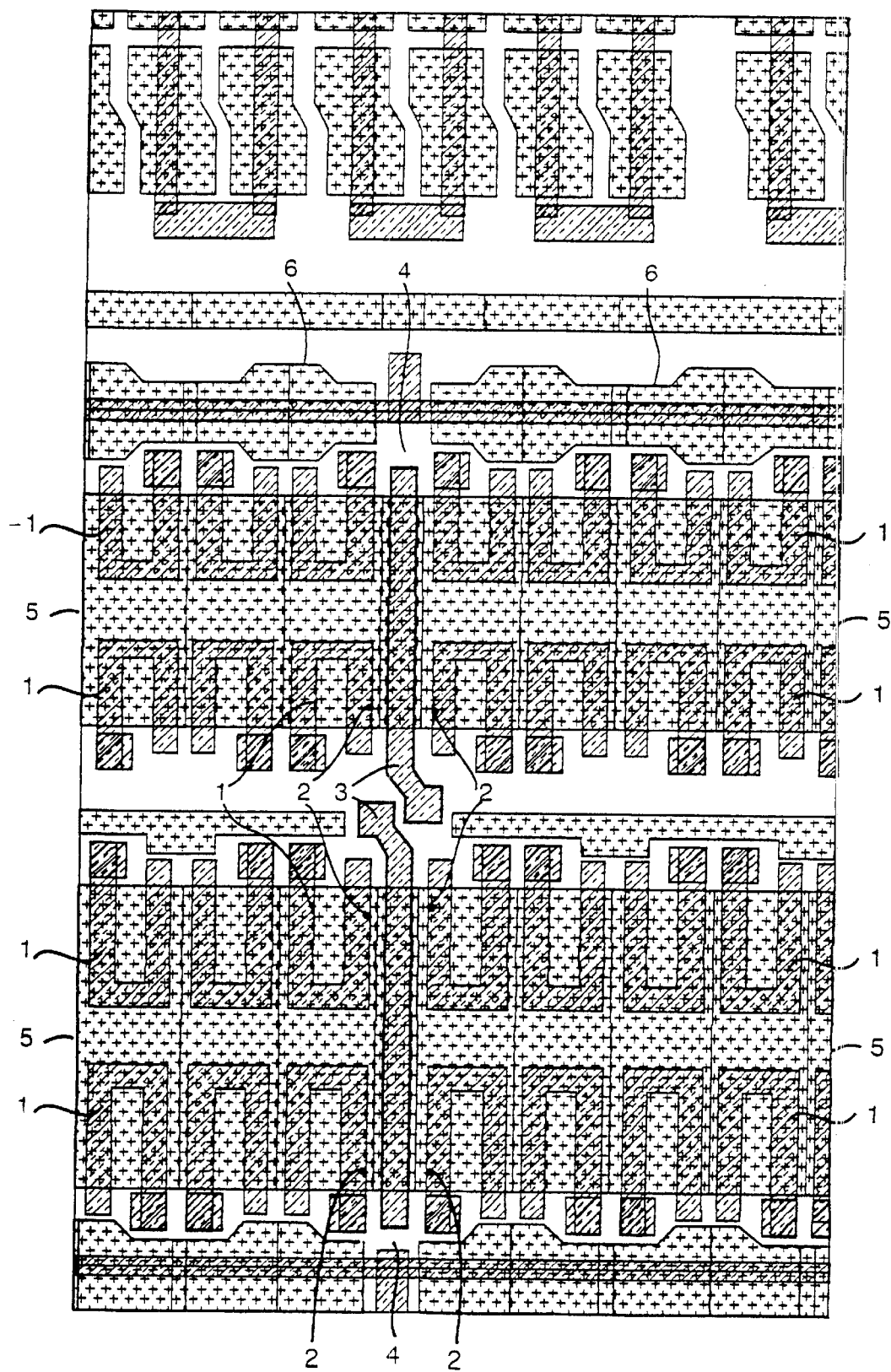

SEMICONDUCTOR MEMORY CONFIGURATION WITH DUMMY COMPONENTS ON CONTINUOUS DIFFUSION REGIONS

BACKGROUND OF THE INVENTION

FIELD OF THE INVENTION

The invention lies in the semiconductor technology field. More specifically, the present invention relates to a semiconductor memory configuration having at least two memory cell arrays provided with strips made up of sense amplifiers, i.e., sense-amp transistors, and drivers. Open areas that are not required are provided between the at least two memory cell arrays for the semiconductor memory configuration.

Integrated semiconductor arrangements with dummy components have been described, for example, in the commonly assigned U.S. patent application Ser. No. 09/017,467 (based on German published patent application DE 197 03 611 A1) and in U.S. Pat. No. 5,796,148.

Semiconductor memory configurations are provided with a multiplicity of memory cell arrays each comprising strips made up of sense-amp transistors and drivers associated with the latter. There exist, thereby , between adjacent memory cell arrays regions or areas which are not fully used and which are caused by the specific design of the semiconductor memory configuration. However, these open areas mean that the position of sense-amp transistors adjoining them is different than that of all the rest of the sense-amp transistors, which adjoin other sense-amp transistors in the strip on both sides. In other words, a sense-amp transistor which adjoins an open area has a different "proximity" than ordinary sense-amp transistors.

It has come to light that the different surroundings of the sense-amp transistors adjoining open areas are a disadvantage for the manufacture of the semiconductor memory configuration: diffusion processes, depositions of polycrystalline silicon for forming gate electrodes and, in particular, lithography operations, and the like, exhibit a somewhat different behavior on the boundary of open areas than in the center of the strip. Although these so-called "proximity effects" are slight, they can certainly be measured and are troublesome during the operation of the semiconductor memory configuration.

In addition, in existing semiconductor memory configurations, the diffusion region of sense-amp transistors is interrupted below the open areas, which is a disadvantage for the manufacture of these semiconductor memory configurations because diffusion regions should be produced as cohesively as possible in order to simplify manufacture.

SUMMARY OF THE INVENTION

It is accordingly an object of the invention to provide a semiconductor memory device with dummy elements on continuous diffusion regions, which overcomes the above-mentioned disadvantages of the heretofore-known devices and methods of this general type and the components of which are impaired as little as possible by proximity effects during manufacture and which is distinguished by continuous diffusion regions.

With the foregoing and other objects in view there is provided, in accordance with the invention, a semiconductor memory configuration, comprising:

at least two memory cell arrays provided with strips made up of sense-amp transistors and drivers;

an open area not required for the semiconductor memory configuration, the open area being disposed between the at least two memory cell arrays;

dummy components formed in the open area, the dummy components being at least largely similar to, or the same as, adjacent components of the memory cell arrays; and a common, continuous diffusion region in which the dummy components and the adjacent components are arranged.

In accordance with a concomitant feature of the invention, the dummy components are dummy transistors.

The invention achieves this object in a semiconductor memory configuration of the type mentioned in the introduction in that the open areas are provided with dummy components which are the same as, or as similar as possible to, the adjacent components of the memory arrays, and in that the dummy components and the adjacent components are arranged in a common, continuous diffusion region. "As similar as possible" is to be understood as meaning that the dummy components are matched to the components as far as possible during processing. These dummy components are preferably dummy transistors. Below the dummy components or dummy transistors, the diffusion region of adjacent components is continuous, so that, with sense-amp transistors, for example, a uniform, continuous diffusion region is produced below the strips of two adjacent memory cell arrays. This allows the yield to be increased considerably when the semiconductor memory configuration is manufactured. The common, continuous diffusion region has unexpectedly been found to raise the radiation tolerance, particularly with regard to alpha radiation.

The dummy transistors can be arranged such that they are turned on when the adjoining memory cell arrays are activated.

Thus, the invention is taking a completely different path than that of the prior art to date: instead of looking for a design which avoids open areas as far as possible, the invention accepts these open areas. However, they are filled with dummy components, particularly transistors, which allows proximity effects in a wide variety of planes to be largely compensated for during diffusion operations, deposition of polycrystalline silicon etc. The components situated at the edge of open areas thus have the same proximity as the other components, so that the result of adding the dummy components is uniform surroundings for the components. Where there are strips of sense-amp transistors, for example, a continuous diffusion region is provided below them.

Other features which are considered as characteristic for the invention are set forth in the appended claims.

Although the invention is illustrated and described herein as embodied in a semiconductor memory configuration with dummy components on continuous diffusion regions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING FIGURES

Figure 2:
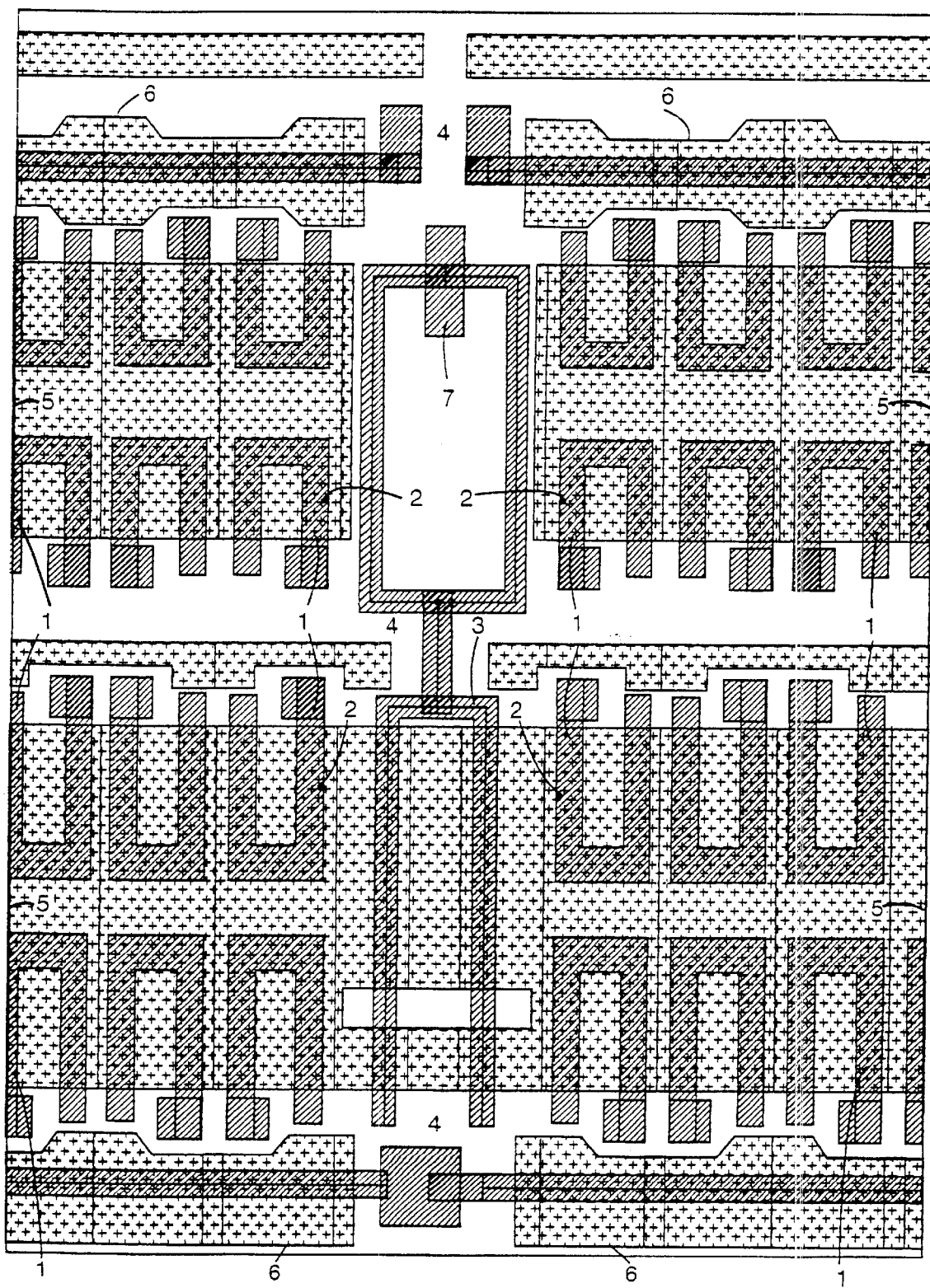

FIG. 1 is a plan view onto strips of sense-amp transistors in two adjacent memory cell arrays with dummy transistors in between, in accordance with a first exemplary embodiment of the invention; and FIG. 2 is a plan view onto strips in two adjacent memory cell arrays with dummy transistors in between, in accordance with a second exemplary embodiment of the present invention.

Functionally and structurally equivalent parts are identified with the same reference numerals throughout the figures.

DESCRIPTION OF THE PREFERRED EMBODIMENTS

Referring now to the figures of the drawing in detail and first, particularly, to FIG. 1 thereof, there are seen a multiplicity of U-shaped sense-amp transistors 1 that are situated next to one another in mutually adjacent strips. The strips in adjacent memory cell arrays have, between them, an open space 4 that separates the sense-amp transistors 1 in two different strips from one another. This means that proximity effects occur particularly at edges 2 of the sense-amp transistors 1 adjoining this open space 4 when they are manufactured, as explained above.

Hence, to prevent these proximity effects, the invention provides for the open areas 4 to contain dummy transistors 3 largely filling up the open areas 4. This entails various advantages:

First, the sense-amp transistors 1 adjoining the open areas 4 "encounter" the same "surroundings" as all the other sense-amp transistors 1, so that proximity effects are largely prevented. In addition, a diffusion region 5 below the two respective strips is uninterrupted or continuous, i.e. there is a uniform diffusion region 5 for N-type sense-amp transistors and for P-type sense-amp transistors, for example.

The strips made up of the sense-amp transistors 1 also have associated drivers 6, each of which may comprise one or more transistors.

The dummy transistors 3 can be connected such that they are turned on whenever the memory cell arrays adjacent to them are activated. If these memory cell arrays are inactive, then the dummy transistors 3 should also be turned off. This ensures that, even during the operation of the device, the edges 2 of the sense-amp transistors adjoining the open area 4 "encounter" the same surroundings as all the rest of the other sense-amp transistors 1.

FIG. 2 shows a plan view of a further illustrative embodiment of the present invention. Here, the dummy transistor 3 is, like the sense-amp transistors 1, of U-shaped design and is provided with an extensive contact region 7. In this illustrative embodiment too, the edges 2 of the sense-amp transistors 1 adjoining the open areas 4 "encounter" practically the same proximity as all the other sense-amp transistors 1, so that the aforementioned proximity effects can be prevented. Below the sense-amp transistors 1 forming the strip, the diffusion region 5 is of uninterrupted or continuous design. The simplifies manufacture quite considerably. In the right-hand half of FIG. 2, the continuous design of the diffusion region 5 has been dispensed with, since the result would otherwise be structures which would be difficult to produce in the process used. This may be different for other processes.

In the semiconductor memory configuration according to the invention, the region between two memory cell arrays has dummy transistors added to partly unused area between strips made up of the sense-amp transistors, said dummy transistors being turned off when the memory cell arrays are inactive. These dummy transistors largely prevent proximity effects in various critical planes during diffusion, deposition of polycrystalline silicon for gate production etc. In addition, a continuous diffusion region is produced below the strips, which significantly increases the yield during manufacture and improves the strength against or resistance to alpha radiation.

The dummy components are preferably transistors, as in the illustrative embodiments above. They do not necessarily have to be transistors, however. Instead, if the surroundings of the open areas comprise diodes, for example, diodes can possibly also be used for the dummy components. It is merely essential that those edges of the respective components which adjoin the open areas 4 encounter the same surroundings as all the other components.

In the exemplary embodiments described above, the sense-amp transistors 1 and the dummy transistors 3 are all MOS field-effect transistors, the channel type being the same in any one diffusion region 5. Hence, in the two diffusion regions 5 shown in each of the two illustrative embodiments, N-channel MOS transistors can be provided for one diffusion region while the other diffusion region 5 contains P-channel MOS transistors. Accordingly, the conduction type of the diffusion regions 5 is then also different.

We claim:

1. A semiconductor memory configuration, comprising:

at least two memory cell arrays provided with strips made up of components including sense-amps transistors and drivers;

an open area being disposed between said at least two memory cell arrays;

dummy components formed in said open area, said dummy componets being similar to adjacent said components of said memory cell arrays; and a common, continuous diffusion region in which said dummy componets and said adjacent components are arranged.

2. The semiconductor memory configuration according to claim 1, wherein said dummy componets are as similar as possible to said adjacent components.

3. The semiconductor memory configuration according to claim 1, wherein said dummy components are dummy transistors.

* * * * *